US011823974B2

(12) United States Patent
Grayson

(10) Patent No.: US 11,823,974 B2
(45) Date of Patent: Nov. 21, 2023

(54) CRYOGENIC SOLID STATE HEAT PUMP

(71) Applicant: Northwestern University, Evanston, IL (US)

(72) Inventor: Matthew Grayson, Evanston, IL (US)

(73) Assignee: Northwestern University, Evanston, IL (US)

( * ) Notice: Subject to any disclaimer, the term of this patent is extended or adjusted under 35 U.S.C. 154(b) by 210 days.

(21) Appl. No.: 17/607,823

(22) PCT Filed: May 1, 2020

(86) PCT No.: PCT/US2020/031082
§ 371 (c)(1),
(2) Date: Oct. 29, 2021

(87) PCT Pub. No.: WO2020/223655
PCT Pub. Date: Nov. 5, 2020

(65) Prior Publication Data
US 2022/0208644 A1 Jun. 30, 2022

Related U.S. Application Data

(60) Provisional application No. 62/841,542, filed on May 1, 2019.

(51) Int. Cl.
*H01L 23/373* (2006.01)
*F25B 1/00* (2006.01)
*F25B 21/00* (2006.01)

(52) U.S. Cl.
CPC ............ *H01L 23/3738* (2013.01); *F25B 1/00* (2013.01); *F25B 21/00* (2013.01); *F25B 2321/003* (2013.01)

(58) Field of Classification Search
CPC ...... F25B 1/00; F25B 21/00; F25B 2321/003; H01L 23/3738; H01L 23/445; Y02B 30/00
See application file for complete search history.

(56) References Cited

U.S. PATENT DOCUMENTS 5,900,071 A * 5/1999 Harman ............... H10N 10/852
136/238
2005/0134167 A1 6/2005 Deguchi et al.
(Continued)

FOREIGN PATENT DOCUMENTS

| CN | 112267937 A | * | 1/2021 | ............ F01P 11/00 |
| WO | WO-9320589 A1 | * | 10/1993 | ............ H01L 35/00 |
| WO | WO-0059047 A1 | * | 10/2000 | ............ H01J 45/00 |

OTHER PUBLICATIONS

International Search Report and Written Opinion dated Jul. 16, 2020 for PCT Application No. PCT/US2020/031082, 8 pages.

*Primary Examiner* — Kun Kai Ma
(74) *Attorney, Agent, or Firm* — BENESCH, FRIEDLANDER, COPLAN & ARONOFF LLP

(57) ABSTRACT

Systems and/or methods can provide for solid-state refrigeration below 1 degree Kelvin. By applying a simple sequence of ac electrical signals to a gated semiconductor device, electrons are cooled in a refrigeration sequence that, in turn, provides cooling directly to the heat load of interest. Electrons in a single subband of a semiconductor quantum well are expanded adiabatically into several subbands, resulting in a temperature drop. Repeated application of this cycle at MHz-GHz frequencies results in a significant cooling power. The anticipated cooling powers can compete with today's standard cryogenic system, the dilution refrigerator, which represents the market standard for achieving cryogenic temperatures.

20 Claims, 2 Drawing Sheets

(56) References Cited

U.S. PATENT DOCUMENTS

| | | |
|---|---|---|
| 2005/0247337 A1 | 11/2005 | Chen et al. |
| 2007/0024154 A1 | 2/2007 | Kucherov et al. |
| 2009/0031733 A1* | 2/2009 | Weaver, Jr. ............. F25B 21/00 62/3.6 |
| 2010/0269879 A1* | 10/2010 | Leavitt ................... H10N 10/13 136/201 |
| 2011/0100408 A1* | 5/2011 | Kushch ................. C23C 14/352 438/54 |
| 2015/0143817 A1 | 5/2015 | Gervais et al. |

* cited by examiner

CRYOGENIC SOLID STATE HEAT PUMP

CROSS-REFERENCE TO RELATED APPLICATIONS

The present application is a National State Entry of PCT International Patent Application No. PCT/US2020/031082, filed May 1, 2020 entitled "Cryogenic Solid State Heat Pump," which claims priority to and the benefit of U.S. Provisional Application No. 62/841,542, filed May 1, 2019 entitled "Cryogenic Solid State Heat Pump," the disclosures of which are all hereby incorporated by reference in their entireties.

STATEMENT OF FEDERALLY FUNDED RESEARCH OR SPONSORSHIP

This invention was made with government support under Grant No. NSF-DMR-0748856 awarded by the National Science Foundation. The government has certain rights in the invention.

BACKGROUND

Today's quantum computers are restricted in size and complexity by the cooling power of the dilution refrigerators that they require. The dilution refrigerator is an extremely cumbersome piece of equipment with several mechanical pumps, pumping lines, and large tanks which can fill a small room.

SUMMARY

According to certain aspects of the present disclosure, a device is provided. The device includes a central reservoir configured to isolate electrons. The device includes a first reservoir in communication with the central reservoir. The device includes a second reservoir in communication with the central reservoir. The electrons are isolated in the central reservoir and expanded from a single subband state into a multi-subband state when the device is selectively operated at a first stage. Heat from the first reservoir is exchanged with the central reservoir when the device operates a second stage responsive to the device operating at the first stage. The electrons are isolated and compressed in the central reservoir from the multi-subband state to the single subband state when the device is selectively operated at a third stage subsequent to the heat being exchanged between the first reservoir and the central reservoir. Excess heat in the central reservoir generated during the second stage is ejected into the second reservoir when the device operates at a fourth stage responsive to the device operating at the third stage.

According to certain aspects of the present disclosure, a method is provided. The method includes selectively operating a device at a first stage to isolate electrons in a central reservoir and expand the electrons from a single subband state into a multi-subband state. The method includes exchanging heat from the first reservoir to the central reservoir when the device operates at a second stage responsive to the device operating at the first stage. The method includes selectively operating the device at a third stage, subsequent to the second stage, to isolate the electrons in the central reservoir and compress the electrons in the central reservoir from the multi-subband state to the single subband state. The method includes ejecting excess heat in the central reservoir, generated during the third stage, into the second reservoir when the device operates at a fourth stage responsive to the device operating at the third stage.

According to certain aspects of the present disclosure, a device is provided. The device includes a central reservoir configured to isolate electrons. The device includes a first reservoir in communication with the central reservoir. The device includes a second reservoir in communication with the central reservoir. The electrons are isolated in the central reservoir and expanded from a single subband state into a triple subband state when the device is selectively operated at a first stage. Heat from the first reservoir is exchanged with the central reservoir when the device operates a second stage responsive to the device operating at the first stage. The electrons are isolated and compressed in the central reservoir from the triple-valley state to the single valley state when the device is selectively operated at a third stage subsequent to the heat being exchanged between the first reservoir and the central reservoir. Excess heat in the central reservoir generated during the second stage is ejected into the second reservoir when the device operates at a fourth stage responsive to the device operating at the third stage.

DESCRIPTION

Systems and methods are described for thermoelectric cooling at cryogenic temperatures, e.g., from 250 mK down to 1 mK, using electrons in a standard transistor structure as the refrigerant "gas" that is alternately expanded and compressed in a Carnot cycle to induce cooling. A thermoelectric mechanism relies on adiabatic expansion from a single subband into multiple subbands, in one instance into the so-called "valley" degree of freedom in quantum wells. This idea is introduced by the PI in this proposal and can be demonstrated experimentally. In some examples, the systems and methods can provide a factor-of-3 cooling in temperature per refrigeration cycle, and cascaded realizations of the same device may achieve over two orders of magnitude in thermal cooing.

The systems and methods can improve cryogenic refrigeration, replacing cumbersome room-filling dilution refrigerators with simple on-chip refrigerators, and allow cryogenic research to advance without further depleting rare helium gas reserves.

Helium is a necessary natural resource for cryogenic research, but the world helium reserves are projected to drop by 30% in the next 7 years, while demand from the medical MRI & semiconductor processing industry is expected only to increase. See, e.g., W. P. Halperin, Nature Phys. 10, 467 (2014), *The impact of helium shortages on basic research*. As a consequence, the low-temperature research required for investigating quantum computation and quantum materials will suffer greatly, preventing advance into the quantum information age. The systems and methods can provide a new cryogenic refrigeration technology which allows research to proceed independently of the world helium supply.

Figure 1:
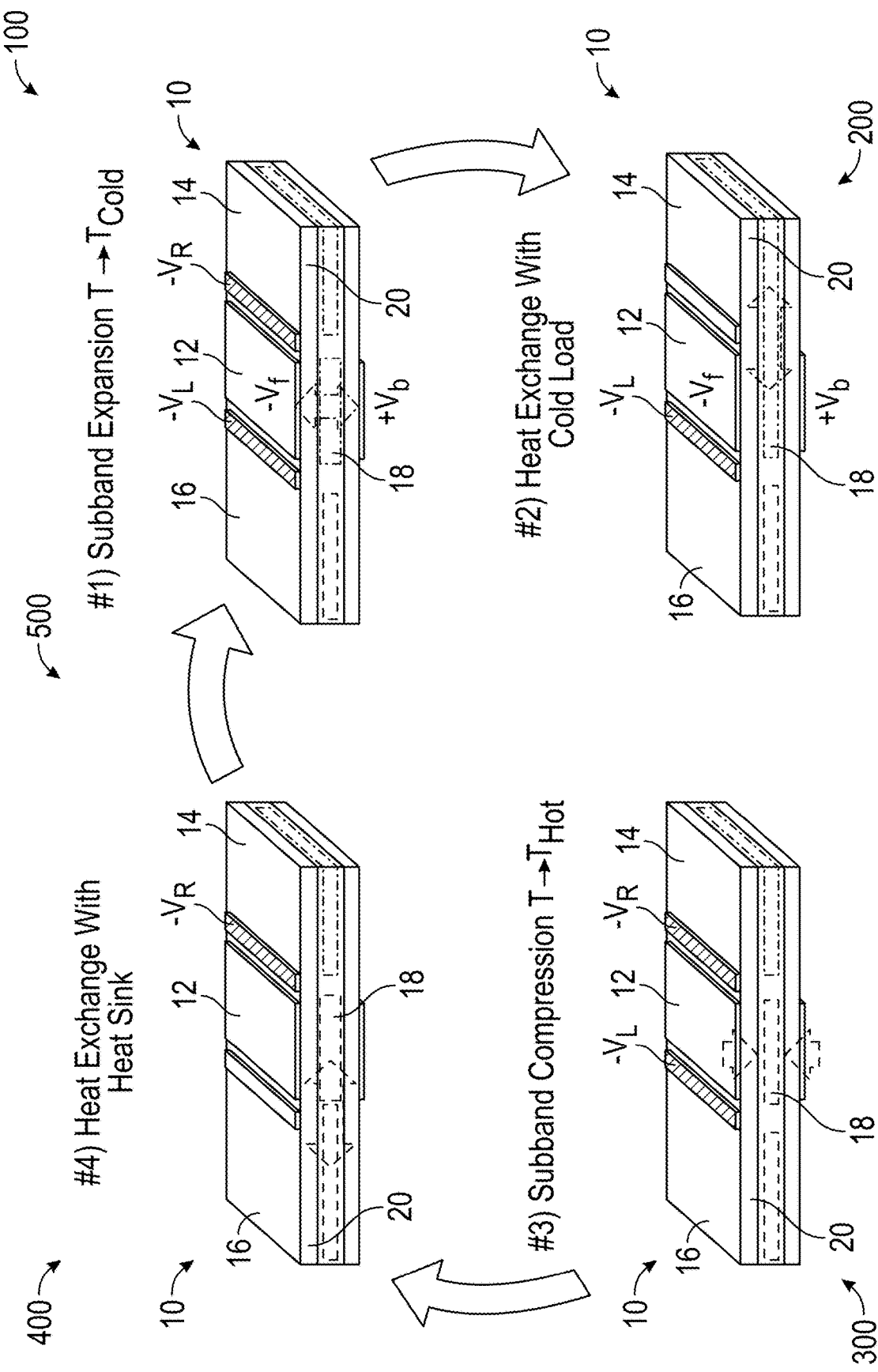
FIG. 1 illustrates an example cryogenic solid state heat pump device.

The systems and methods can create a semiconductor heat pump using adiabatic expansion of electrons in a central region to extract heat from one reservoir, and then use adiabatic compression to eject heat to the opposite reservoir (See FIG. 1).

FIG. 1 illustrates an example cryogenic solid state heat pump device 10, as depicted in stages 100, 200, 300, 400. The device 10 can include a thin layer of hot electrons (red) and cold electrons (blue) with the central electron reservoir 12 serving as a heat pump. The Carnot cycle starts, at the stage 100 (e.g., step #1), with electrons in the central isolated region 12 expanded into a multi-subband degeneracy state to cool them. Heat is then extracted from the right reservoir 14 as it equilibrates with the center region 12, at stage 200 (e.g., step #2), after which the central region 12 is isolated again and compressed, as illustrated at the stage 300 (e.g., step #3). The excess heat can now be ejected into the left hot reservoir 16, at stage 400 (e.g., step #4). The central region 12 is isolated and the Carnot cycle begins again.

A first aspect of the device 10 includes the "expansion" in this Carnot cycle, which does not physically expand the electron layer 18, but increases the number of degrees of freedom by a factor of the number of subbands by applying a gate voltage. These degrees of freedom in one instance are called "valleys," a common feature in industry semiconductors such as silicon, germanium, and aluminum arsenide. The second aspect includes the cyclic nature of the cooling. Previous theory considered only single-shot cooling (e.g., L. G. C. Rego and G. Kircenow, Appl. Phys. Lett. 75, 2262 (1999), *Electrostatic mechanism for cooling semiconductor heterostructures*), whereas the device can continuously cool by running the Carnot cycle at MHz frequencies.

In the present realization, a 2D layer of aluminum arsenide grown on the (111) plane can be used to tune the electrons from a single subband to triple-subband occupancy, thereby cooling the electron temperature by a factor of 3 from $T_1$ to $T_2=\frac{1}{3}T_1$. Repeated application of this cycle can cool an entire semiconductor chip, and a multistage cooler with N stages can cool by N factors of ⅓ to $T_2=\frac{1}{3}NT_1$. A starting temperature of $T_1=250$ mK may be used since it is readily achievable with a simple closed-cycle $^3$He refrigerator, and the cascaded-stage refrigerator can cool down to 1 mK. This technology can make cumbersome room-filling dilution refrigerators obsolete, replaced by a cooling element with dimensions 5×5×0.5 mm3.

The device 10 can contain a reservoir of electrons in a thin layer called a quantum well 18. The electrons occupy the lowest energy state of the quantum well 18, called the lowest subband. This reservoir is designed so that small changes in the electrostatic confinement can cause higher subband(s) to lower their energy, thereby allowing the electron gas to adiabatically "expand" into these subbands 20, lowering their temperature. By connecting these cooled electrons to a thermal load and isolating them again before "compressing" the electrons back to a single subband, a heat pump cycle 500 (e.g., the stages 100, 200) is defined which can be repeated at high frequencies to induce a large amount of cooling power.

The cooling principle in use is a cyclic adiabatic expansion of a two-dimensional electron gas inside of a semiconductor quantum well. The subband expansion device consists of a quantum well 18 in a semiconductor with an additional subband or subbands whose energy can be tuned both above and below the Fermi energy by of order ~kT, where k is the Boltzman constant, and T is the hot-side operating temperature, in this case around T=1 K. A capacitive gate over the cooling reservoir will tune the subband energies from above to below the Fermi energy (cooling step) and from below to above the Fermi energy (heating step) with set of tunable electrostatic gates that alternately couple to the neighboring heat load for the cooling step and to the heat sink for the heating step. One candidate semiconductor for this implementation is an aluminum arsenide AlAs quantum well which is slightly miscut from the nominal crystal axis. This semiconductor contains multiple valleys, and the miscut angle slightly imbalances the energy of those valleys so that an electrostatic gate can the relative energies of these valleys to induce the refrigeration effect described above.

Quantum wells can be grown according to the above. These structures can be tuned from single subband occupancy to multi-subband occupancy with application of a gate voltage, verified with the quantum Hall effect. A low-temperature thermometer may be fabricated with low-cost pre-amplifiers so that absolute temperatures can be deduced from the thermal noise. The electron heat pump can be tested by making a thinned sample with front-gates, back-gates, and throttle gates as shown in FIG. 1.

Figure 2:
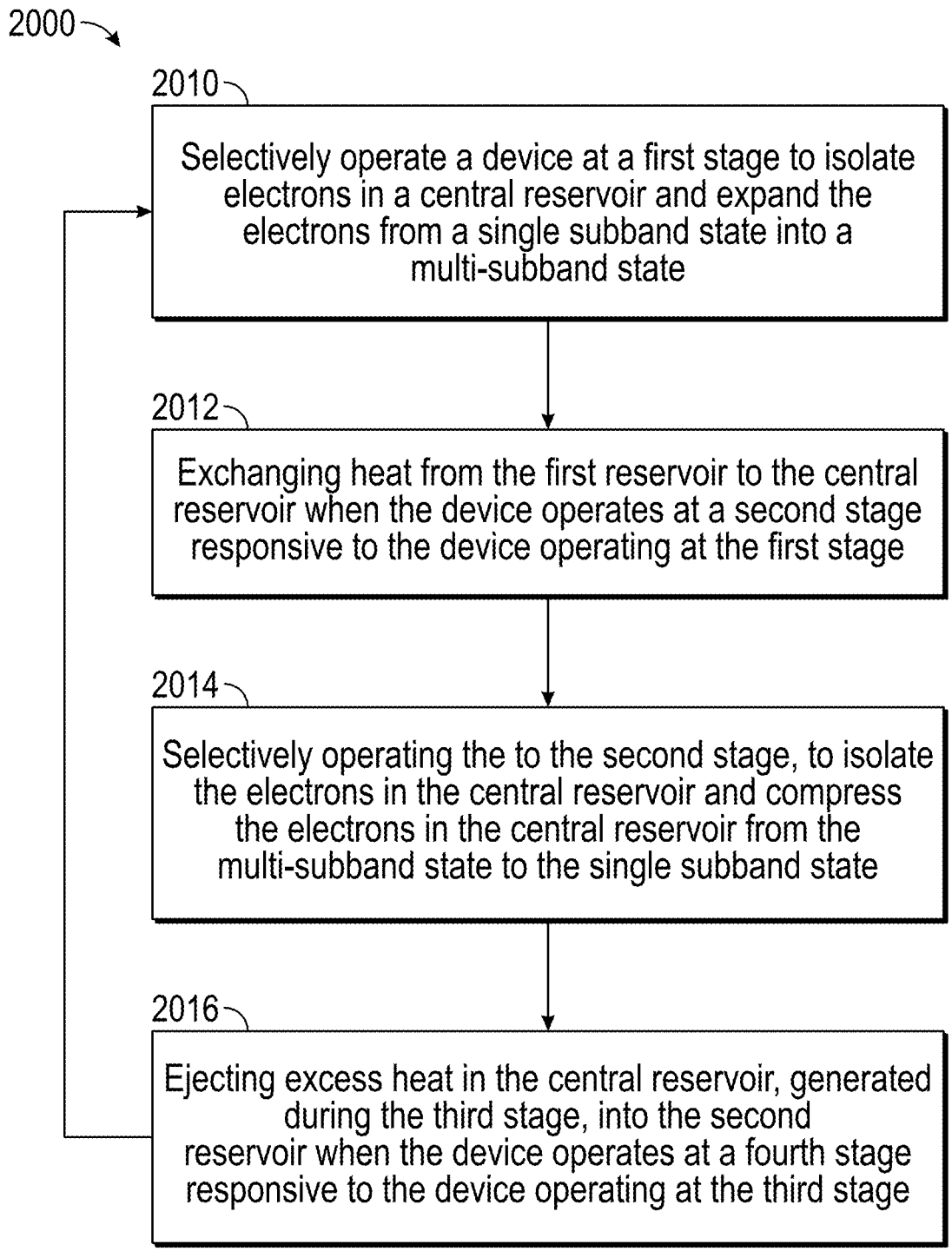
FIG. 2 illustrates an example process for operating the example cryogenic solid state heat pump device of FIG. 1.

FIG. 2 illustrates an example process 2000 for operating the example device 10 of FIG. 1. While FIG. 2 is described with reference to FIG. 1, it should be noted that the process steps of FIG. 2 may be performed by other systems.

The process 2000 begins by proceeding to step 2010 where the device 10 is selectively operated at the first stage 100 to isolate electrons in a central reservoir (e.g., the central isolated region 12) and expand the electrons from a single subband state into a multi-subband state. As illustrated at step 2012, the device 10 operates at the second stage 200 to exchange heat from a first reservoir (e.g., the right reservoir 14) to the central reservoir. The device 10 is selectively operated at the third stage 300, subsequent to the second stage, to isolate the electrons in the central reservoir and compress the electrons in the central reservoir from the multi-subband state to the single subband state, as depicted at step 2014. As illustrated at step 2016, the device operates at the fourth stage 400 to eject heat in the central reservoir, that was generated during the third stage 300, into a second reservoir (e.g., the left reservoir 16) when the device 10 operates at the fourth stage 400 responsive to the device 10 operating at the third stage 300. As illustrated by the return arrow, the process can then proceed back to step 2010.

Applications of the systems, methods and devices may include, but are not limited to, quantum computation at temperatures below T<0.1 K to operate, and/or laboratory research on the fundamental properties of materials and quantum phenomena at major research labs and universities throughout the world which may require the lowest possible cryogenic temperatures.

Advantages may include, but are not limited to, cooling powers exceeding 500 uW at 100 mK, small chip to yield an equivalent amount of cooling power, greatly simplifying the refrigeration process and providing enough cooling power for scalable quantum computers to finally be built, and/or an all-electrical solid-state cooling mechanism, robust against the typical failure modes of the dilution refrigerator, namely gas leaks, gas contamination, clogged flow lines, leaky heat exchangers, etc.

While various embodiments have been described, it can be apparent that many more embodiments and implementations are possible. Accordingly, the embodiments are not to be restricted.

I claim:
1. A device, comprising:
a central reservoir configured to isolate electrons;
a first reservoir in communication with the central reservoir; and a second reservoir in communication with the central reservoir, wherein the electrons are isolated in the central reservoir and expanded from a single subband state into a multi-subband state when the device is selectively operated at a first stage, wherein heat from the first reservoir is exchanged with the central reservoir when the device operates a second stage responsive to the device operating at the first stage, wherein the electrons are isolated and compressed in the central reservoir from the multi-subband state to the single subband state when the device is selectively operated at a third stage subsequent to the heat being exchanged between the first reservoir and the central reservoir, and wherein excess heat in the central reservoir generated during the second stage is ejected into the second reservoir when the device operates at a fourth stage responsive to the device operating at the third stage.

2. The device of claim 1, wherein the device is configured to cyclically operate between the first stage and the fourth stage.

3. The device of claim 1, wherein the device operates at frequencies in the Megahertz (MHz) range.

4. The device of claim 1, wherein the device comprises a dimension in a range of 5 millimeters by 5 millimeters by 0.5 millimeters.

5. The device of claim 1, wherein the electrons include a first temperature when the first stage begins and include a second temperature when the first stage ends.

6. The device of claim 5, wherein the second temperature is one third of the first temperature.

7. The device of claim 1, further comprising a gate associated with the second reservoir wherein a voltage is applied to the gate to selectively operate the device at the first stage.

8. The device of claim 1, wherein the device comprises a layer formed of aluminum arsenide.

9. The device of claim 8, wherein the layer formed of aluminum arsenide comprises a miscut angle.

10. The device of claim 1, further comprising a cold load in communication with the first reservoir.

11. The device of claim 1, further comprising a heat sink in communication with the second reservoir.

12. A method, comprising:
selectively operating a device at a first stage to isolate electrons in a central reservoir and expand the electrons from a single subband state into a multi-subband state, wherein the central reservoir is in communication with a first reservoir;
exchanging heat from the first reservoir to the central reservoir when the device operates at a second stage responsive to the device operating at the first stage;
selectively operating the device at a third stage, subsequent to the second stage, to isolate the electrons in the central reservoir and compress the electrons in the central reservoir from the multi-subband state to the single subband state, wherein the central reservoir is in communication with a second reservoir; and
ejecting excess heat in the central reservoir, generated during the third stage, into the second reservoir when the device operates at a fourth stage responsive to the device operating at the third stage.

13. The method of claim 12, further comprising:
cyclically operating the device between the first stage and the fourth stage.

14. The method of claim 12, wherein the device operates at frequencies in the Megahertz (MHz) range.

15. The method of claim 12, wherein the device comprises a dimension in a range of 5 millimeters by 5 millimeters by 0.5 millimeters.

16. The method of claim 12, wherein the electrons include a first temperature when the first stage begins and include a second temperature when the first stage ends.

17. The method of claim 16, wherein the second temperature is one third of the first temperature.

18. The method of claim 12, wherein the device comprises a layer formed of aluminum arsenide.

19. The method of claim 18, wherein the layer formed of aluminum arsenide comprises a miscut angle.

20. A device, comprising:
a central reservoir configured to isolate electrons;
a first reservoir in communication with the central reservoir; and
a second reservoir in communication with the central reservoir, wherein the electrons are isolated in the central reservoir and expanded from a single-valley state into a triple-valley state when the device is selectively operated at a first stage, wherein heat from the first reservoir is exchanged with the central reservoir when the device operates a second stage responsive to the device operating at the first stage, wherein the electrons are isolated and compressed in the central reservoir from the triple-valley state to the single valley state when the device is selectively operated at a third stage subsequent to the heat being exchanged between the first reservoir and the central reservoir, and wherein excess heat in the central reservoir generated during the second stage is ejected into the second reservoir when the device operates at a fourth stage responsive to the device operating at the third stage.

* * * * *